(12) United States Patent
Hirasawa et al.

(10) Patent No.: US 10,919,710 B2
(45) Date of Patent: Feb. 16, 2021

(54) TRANSPORT UNIT, TRANSFER APPARATUS, AND TRANSFER METHOD

(71) Applicant: HIRATA CORPORATION, Kumamoto (JP)

(72) Inventors: Yoichi Hirasawa, Kumamoto (JP); Shuichi Komuro, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 530 days.

(21) Appl. No.: 15/957,366

(22) Filed: Apr. 19, 2018

(65) Prior Publication Data

US 2018/0244480 A1 Aug. 30, 2018

Related U.S. Application Data

(63) Continuation of application No. PCT/JP2015/080255, filed on Oct. 27, 2015.

(51) Int. Cl.
*B29C 53/16* (2006.01)
*B65G 47/91* (2006.01)
(Continued)

(52) U.S. Cl.
CPC ............ *B65G 47/91* (2013.01); *B25J 15/06* (2013.01); *B25J 15/0616* (2013.01);
(Continued)

(58) Field of Classification Search
None
See application file for complete search history.

(56) References Cited

U.S. PATENT DOCUMENTS

| 6,206,352 B1 * | 3/2001 | Ishitani | H05K 13/0069 |
| | | | 269/13 |
| 2014/0215813 A1 * | 8/2014 | Kishimoto | H05K 13/08 |
| | | | 29/739 |

FOREIGN PATENT DOCUMENTS

JP 2-10318 U 1/1990
JP 9-199848 A 7/1997
(Continued)

OTHER PUBLICATIONS

Partial English language translation of Japanese Patent Application No. 09-199848, previously filed on Apr. 19, 2018 (4 pages).
(Continued)

*Primary Examiner* — Jeffrey M Wollschlager
*Assistant Examiner* — Armand Melendez
(74) *Attorney, Agent, or Firm* — Buchanan Ingersoll & Rooney PC

(57) ABSTRACT

A distorted substrate is positioned in a predetermined position and corrected, thereby improving the substrate transfer efficiency. A transport unit capable of transporting and positioning a substrate includes a transport mechanism for transporting the substrate to an unloading position, and a positioning mechanism for positioning the substrate in the unloading position. The positioning mechanism includes a regulating member including at least two pairs of regulating portions capable of abutting against the opposing end faces of the substrate, an abutment moving mechanism for moving one regulating portion toward the other regulating portion in each of the at least two pairs of regulating portions, and a regulation moving mechanism capable of moving the regulating member in a direction in which the substrate is pressed.

3 Claims, 12 Drawing Sheets

(51) Int. Cl.
*H01L 21/677* (2006.01)
*H05K 13/08* (2006.01)
*H05K 13/00* (2006.01)
*B25J 15/06* (2006.01)
*B65G 49/06* (2006.01)
*H05K 3/00* (2006.01)
*B30B 15/32* (2006.01)

(52) U.S. Cl.
CPC ............ *B29C 53/16* (2013.01); *B65G 49/061* (2013.01); *H01L 21/67706* (2013.01); *H05K 13/0069* (2013.01); *H05K 13/08* (2013.01); *B30B 15/32* (2013.01); *B65G 2201/0214* (2013.01); *B65G 2249/04* (2013.01); *H05K 3/00* (2013.01); *H05K 2203/15* (2013.01); *H05K 2203/1545* (2013.01); *Y10T 29/532* (2015.01); *Y10T 29/53174* (2015.01); *Y10T 29/53191* (2015.01)

(56) References Cited

FOREIGN PATENT DOCUMENTS

| | | |
|---|---|---|
| JP | 3421713 B2 | 6/2003 |
| JP | 2009-130011 A | 6/2009 |
| JP | 2011-26111 A | 2/2011 |
| JP | 2011-192781 A | 9/2011 |
| JP | 2014-154627 A | 8/2014 |
| WO | WO 2007-037005 A1 | 4/2007 |
| WO | WO 2015/052763 A1 | 3/2017 |

OTHER PUBLICATIONS

Partial English language translation of Japanese Patent Application No. 3421713, previously filed on Apr. 19, 2018 (7 pages).
International Search Report (PCT/ISA/210) dated Dec. 15, 2015, by the Japanese Patent Office as the International Searching Authority for International Application No. PCT/JP2015/080255.
Written Opinion (PCT/ISA/237) dated Dec. 15, 2015, by the Japanese Patent Office as the International Searching Authority for International Application No. PCT/JP2015/080255.

\* cited by examiner

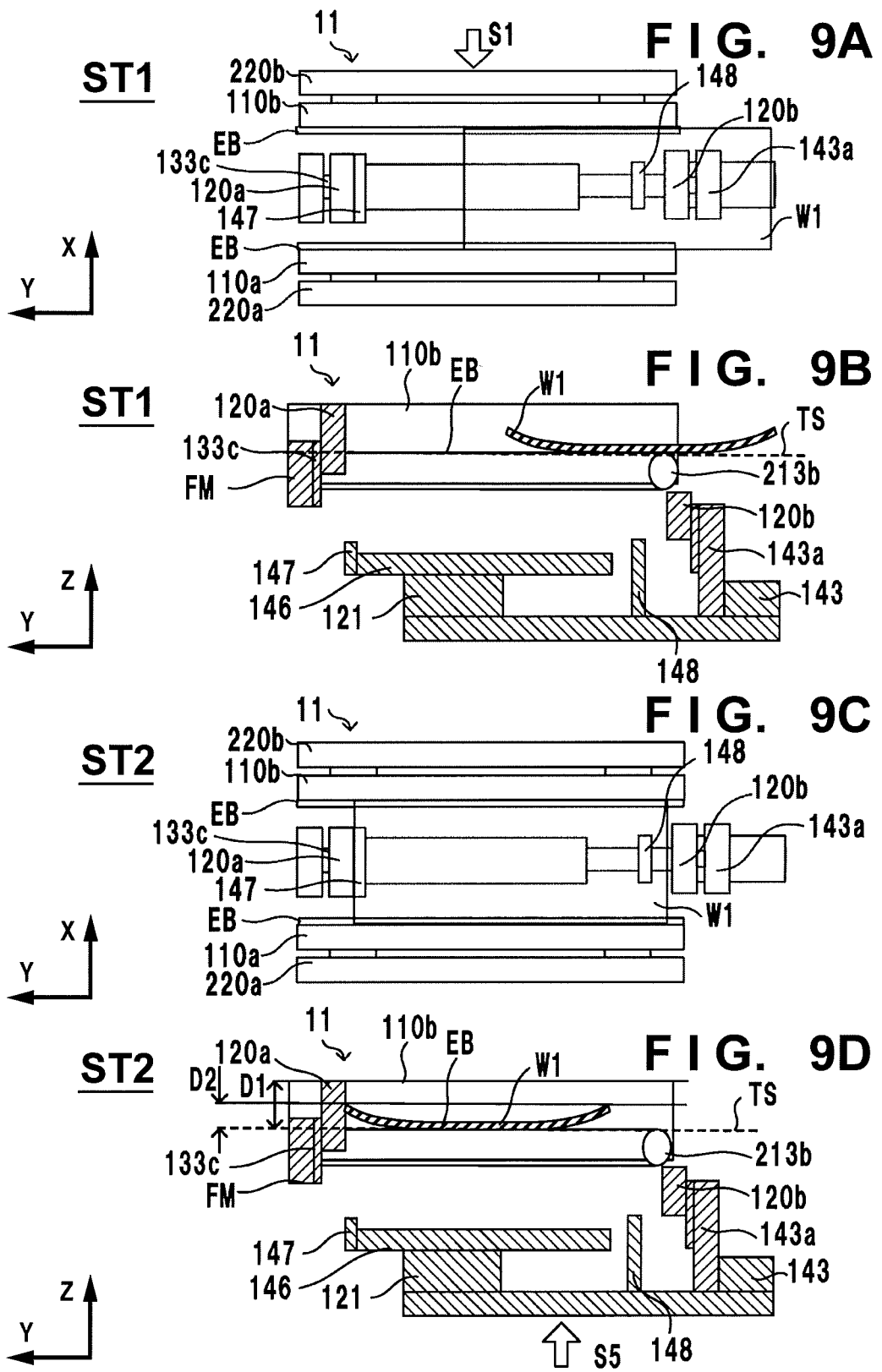

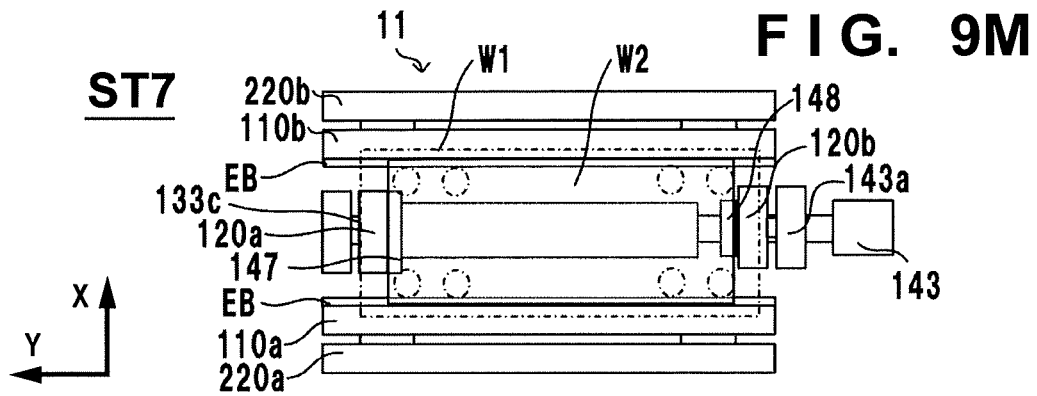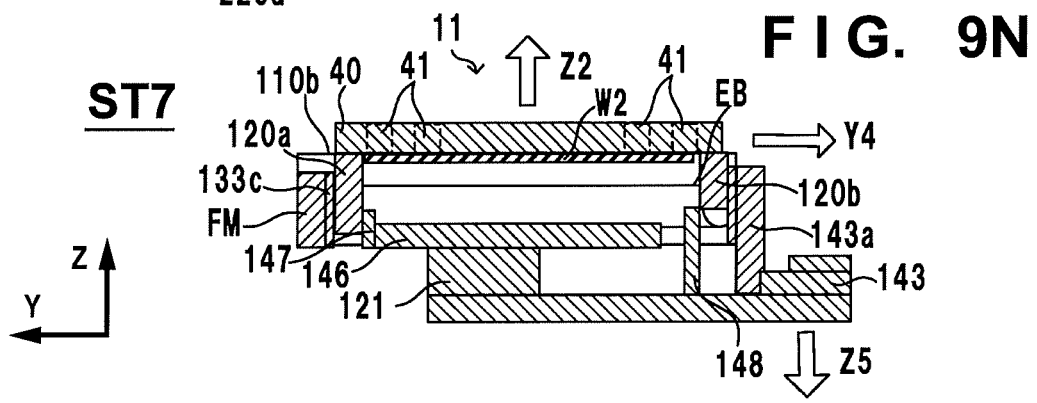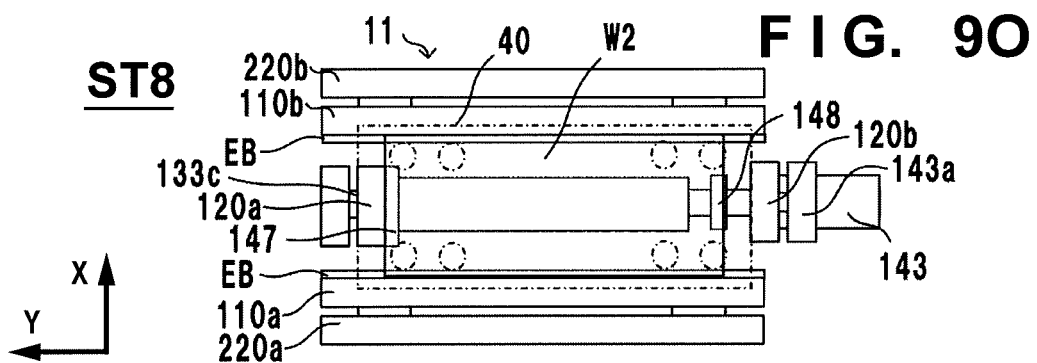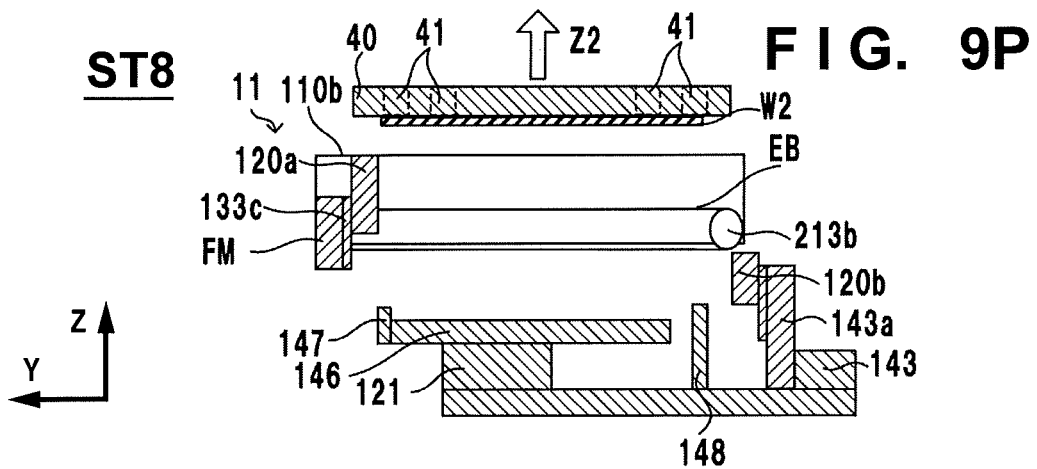

TRANSPORT UNIT, TRANSFER APPARATUS, AND TRANSFER METHOD

This application is a continuation of International Patent Application No. PCT/JP2015/080255 filed on Oct. 27, 2015, the entire content of which is incorporated herein by reference.

TECHNICAL FIELD

The present invention relates to a transport unit, transfer apparatus, and transfer method which convey a distorted plate member, regulate the position of the distorted plate member while correcting the distorted plate member into a horizontal state, and transfer the corrected plate member.

BACKGROUND ART

Conventionally, when conveying a distorted (or bent) rectangular plate member (for example, a resin substrate), the distorted curved plate member is sometimes corrected into a horizontal state (flat or straight) and transferred. An example of the rectangular plate member is an electronic substrate on which an electronic part is mounted. In the manufacturing process, an electronic substrate like this is transported to a heat treatment step such as a soldering process in order to connect a part and the substrate. This substrate having undergone the heat treatment step is sometimes deformed, that is, warped in the surface direction of the substrate, or distorted, under the influence of heat. Then, the deformed substrate is transported to another different step by a transport apparatus (for example, a conveyor), and further processed. When transported to another step, the substrate itself is directly supported and transported, or the substrate is transported as it is accommodated in an accommodating member. To perform a predetermined process in a processing step at the transport destination, the substrate is transferred to a dedicated processing apparatus again, or transferred to a different transport path. If the substrate is kept distorted in a transfer work like this, the transfer apparatus cannot easily hold the substrate, so the substrate is made easy to hold by correcting the distortion.

Substrates are distorted in many ways. For example, a rectangular substrate is sometimes distorted as it is curved in the surface direction such that a pair of opposing sides approach each other and shorten the total length. A distortion like this sometimes poses the following problems. For example, an excess stress is given to the substrate if a worker carelessly handles the substrate, and the weight of a part mounted on the substrate further deforms the substrate. Also, in a cooling step after the substrate is heat-treated, a distortion in the surface direction sometimes occurs due to the difference between heat radiation rates on the surface of the substrate (see Japanese Patent Laid-Open No. 09-199848).

Furthermore, when reliably holding the deformed substrate like this and transferring the substrate by the transfer apparatus, it is necessary to correct the distortion of the deformed substrate and position the substrate in a substrate unloading position by the transfer apparatus at the same time. In one example of the transfer apparatus like this, a holding unit of the apparatus approaches the deformed substrate from above the substrate, temporarily stops in a position where pressing is incomplete, and abuts one side of the deformed substrate against a reference member which functions as a reference. More specifically, a moving member including a biasing function abuts against the deformed substrate from the other side of the substrate, thereby moving the substrate toward the reference member and abutting one side of the substrate against the reference member. After that, the holding unit of the transfer apparatus further presses the deformed substrate downward from above the substrate, and the biasing mechanism of the moving member gradually absorbs the extension of the substrate from one side to the other, thereby correcting the substrate. Then, the holding unit holds the substrate by suction (see Japanese Patent No. 3421713).

After the deformed substrate is corrected, the corrected substrate is held and transferred. To improve the work efficiency, the transfer apparatus must perform an efficient transfer operation as a whole. In addition, a high transfer accuracy is sometimes necessary when placing the substrate on the transfer destination.

The apparatus described in Japanese Patent Laid-Open No. 09-199848 performs specific processing (a cooling process) in order to change (return) the deformed substrate to the original state (undeformed state). Since, however, the time of this processing step and the time of transfer to the processing step are necessary, the work efficiency of the whole apparatus may decrease. Also, the apparatus described in Japanese Patent No. 3421713 corrects the deformed substrate by the phased cooperation of the positioning mechanism and holding unit. This requires the time for checking the works of the mechanism and unit several times. In addition, after the holding unit holds the corrected substrate, the substrate cannot be transferred unless positioning by the positioning mechanism is completely canceled. This may decrease the work efficiency of the whole transfer work.

SUMMARY OF INVENTION

It is, therefore, an object of the present invention to position a distorted substrate in a predetermined position and correct the substrate at the same time, thereby improving the substrate transfer efficiency.

According to an aspect of the present invention, there is provided a transport unit capable of transporting and positioning a substrate, comprising a transport mechanism configured to transport the substrate to an unloading position, and a positioning mechanism configured to position the substrate in the unloading position, wherein the positioning mechanism includes a regulating member including at least two pairs of regulating portions configured to abut against opposing end faces of the substrate, an abutment moving mechanism configured to move one regulating portion toward the other regulating portion in each of the at least two pairs of regulating portions, and a regulation moving mechanism configured to move the regulating member in a direction in which the substrate is pressed.

According to another aspect of the present invention, there is provided a transfer method of transporting and positioning a curved substrate, correcting the substrate into a straight shape by pressing a substrate surface of the substrate, and transferring the corrected substrate, characterized by comprising a setting step of setting a work range for the substrate based on a contour of the substrate in an uncurved straight state, a correction step of correcting the substrate into a straight shape by pressing a pressing member against the substrate surface of the substrate within the work range, a positioning step of positioning the corrected substrate, a suction holding step of holding the positioned corrected substrate by suction, and a transfer step of transferring the corrected substrate held by suction.

Further features of the present invention will become apparent from the following description of exemplary embodiments (with reference to the attached drawings).

BRIEF DESCRIPTION OF DRAWINGS

FIG. 9A is a view for explaining the operation of the transfer apparatus in state ST1;

FIG. 9B is a view for explaining the operation of the transfer apparatus in state ST1;

FIG. 9C is a view for explaining the operation of the transfer apparatus in state ST2;

FIG. 9D is a view for explaining the operation of the transfer apparatus in state ST2;

FIG. 9M is a view for explaining the operation of the transfer apparatus in state ST7;

FIG. 9N is a view for explaining the operation of the transfer apparatus in state ST7;

FIG. 9O is a view for explaining the operation of the transfer apparatus in state ST8; and FIG. 9P is a view for explaining the operation of the transfer apparatus in state ST8.

DESCRIPTION OF EMBODIMENTS

Figure 1A:
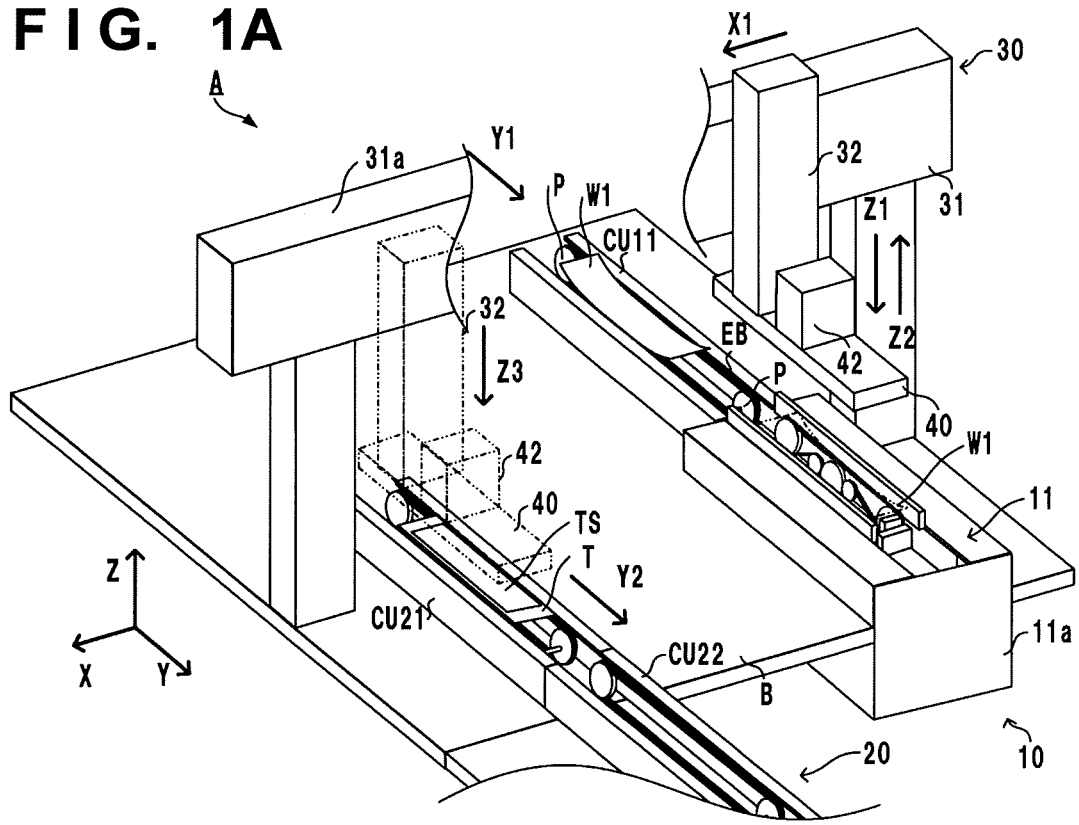
FIG. 1A is a perspective view of a transfer apparatus according to one embodiment of the present invention.

An exemplary embodiment of the present invention will be explained below with reference to the accompanying drawings. Note that in these drawings, the same reference numerals denote the same elements, and the top, bottom, left, and right on the drawing surface correspond to the top, bottom, left, and right of an apparatus or member in this embodiment, and are so used in the explanation of the text. Note also that in FIGS. 1 to 7 and 9A to 9P, an arrow Z indicates the top-to-bottom direction (vertical direction), and arrows X and Y indicate horizontal directions perpendicular to each other.

FIG. 1A is a perspective view of a transfer apparatus A according to the embodiment of the present invention. The transfer apparatus A conveys a substrate W, which is conveyed from an upstream side Y1 (the upper left side in FIG. 1A) in the Y direction, to a downstream side Y2 (the lower right side in FIG. 1A) in the Y direction. Examples of the substrate W are a flexible film-like substrate such as an FPC (Flexible Printed Circuit) board, flexible film, flexible sheet, and flexible foil. The substrate W of this embodiment is a thin plate member having an oblong shape in a planer view. The substrate W is a substrate W1 in which end portions in the longitudinal direction warp in the upper surface direction before being loaded into the transfer apparatus A for the reason to be described later, and is a substrate W2 corrected into a flat plate shape when unloaded from the transfer apparatus A.

The transfer apparatus A includes a first conveyor 10, a second conveyor 20, and a transfer unit 30 fixed on a base B. The first conveyor 10 and second conveyor 20 for conveying the substrate W are parallel to each other in the conveyance direction (the Y direction in FIG. 1A) of the substrate W, and spaced apart from each other. Each of the first conveyor 10 and second conveyor 20 conveys the substrate W from the upstream side to the downstream side in the Y direction.

<Transfer Unit 30>

The transfer unit 30 includes a gate-like base portion 31 which strides over the first conveyor 10 and second conveyor 20, a moving portion 32 movably formed on a horizontal portion 31a of the base portion 31, and a holding unit 40 attached to the moving portion 32. The horizontal portion 31a is supported on two legs formed on the base B. Note that in FIG. 1A, the horizontal portion 31a of the base portion 31 is partially omitted in order to explain the first conveyor 10. The moving portion 32 can be moved by a driving mechanism (not shown) in the horizontal direction (X direction) and the vertical direction (Z direction) with respect to the base portion 31 (the horizontal portion 31a). A known mechanism can be adopted as the driving mechanism. For example, the driving mechanism can be configured by a driving source such as a motor, and a transmitting mechanism (for example, a belt transmitting mechanism, ball-screw mechanism, or rack-pinion mechanism) for transmitting the driving force of the driving source. The holding unit 40 attached to the moving portion 32 can be moved in the horizontal direction (X direction) and the vertical direction (Z direction) by the moving portion 32.

Figure 1B:
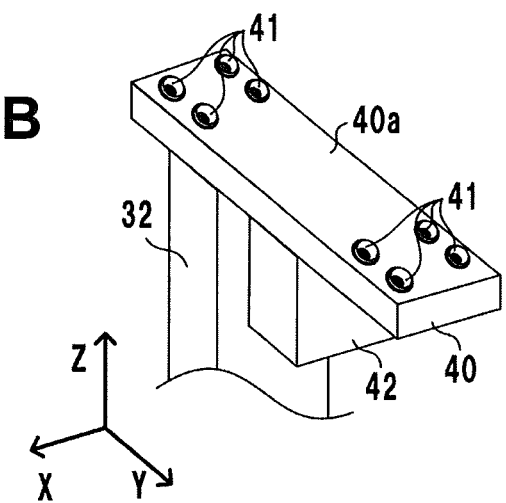
FIG. 1B is a perspective view of a holding member.

FIG. 1B is a perspective view showing the holding unit 40 from below in the Z direction. The holding unit 40 includes a flat lower surface (pressing member) 40a on the lower surface in the Z direction, and a plurality of (in this embodiment, eight) suction portions 41 in predetermined portions of the lower surface 40a. Four suction portions 41 are formed near each of the two end portions in the longitudinal direction of the rectangular lower surface 40a. Since the suction portions 41 are arranged in at least four corners of the rectangle, the substrate W can be held by suction with a stable posture being kept in the horizontal direction. Each suction portion 41 is connected to a positive pressure/negative pressure controller 42 arranged on the upper side surface of the holding unit 40. The positive pressure/negative pressure controller 42 is connected to a positive pressure/negative pressure generation source (not shown), such as a compressor, vacuum pump, or compressed air tank, installed in a factory or facility, and can control each suction portion 41 by blowing air from the suction portion 41 or setting a negative pressure in the suction portion 41.

As will be described later, when approaching the substrate W1 warped upward, each suction portion 41 blows air and sprays air to a portion to be sucked of the substrate W1 warped upward, thereby reducing the resistance when the suction portion 41 and warped substrate W1 come in contact with each other. After the suction portion 41 comes in contact with the warped substrate W1, the suction portion 41 holds the substrate W1 by suction by setting a negative pressure in the suction portion 41. An example of the suction portion 41 is a funnel-shaped flexible member having an opening which widens downward. Each suction portion 41 may also be formed such that the suction portion 41 is partially projected from the lower surface 40a of the holding unit 40 so as to allow easy contact with the warped substrate W1, and moved (retracted) inside the holding unit 40 from the lower surface 40a after the suction portion 41 holds the warped substrate W1 by suction. This can correct the deformation of the warped substrate W1 because the lower surface 40a of the holding unit 40 (to be described later) abuts against the surface of the warped substrate W1. It is also possible to hold the warped substrate W1 in a state in which the surface of the warped substrate W1 held by the suction portions 41 is abutted against the lower surface 40a.

<Outline of Operation of Transfer Apparatus A>

An outline of the operation when the transfer apparatus A conveys the substrate W will be explained below with reference to FIG. 1A. In this embodiment, a substrate supply apparatus (not shown) is installed on the upstream side (in the upper left portion of FIG. 1A) of the transfer apparatus A in the Y direction. An example of the substrate supply apparatus is an apparatus which washes a substrate and heats (dries) the substrate after that. Accordingly, an example of the substrate to be supplied from the substrate supply apparatus is the warped substrate W1 having a shape in which a pair of opposing sides are deformed upward by heating over the substrate in the longitudinal direction. Note that the warped substrate W1 is not limited to a substrate warped by heating, and it is possible to adopt any form in which a substrate is not straight but curved by predetermined processing, for example, distorted by chemical processing.

The warped substrate W1 is transported from the substrate supply apparatus to the first conveyor 10 in the direction of an arrow Y1. In this embodiment, the first conveyor 10 includes a conveyor unit CU11 on the upstream side and a transport unit 11 on the downstream side. When the warped substrate W1 is supplied to the first conveyor 10, the conveyor unit CU11 transports the substrate W1 to the transport unit 11 connected to the downstream side of the conveyor unit CU11. The warped substrate W1 transported to the transport unit 11 is placed and positioned in a predetermined unloading position by processing to be described later.

The warped substrate W1 placed by the transport unit 11 is pressed down in the direction of an arrow Z1 by the holding unit 40 having moved down from above, positioned by the transport unit 11, and held by suction by the suction portions 41 of the holding unit 40. When the holding unit 40 presses the warped substrate W1, the warpage is corrected, and the substrate W1 becomes the corrected substrate W2 having a horizontal surface. Then, the positioned and corrected substrate W2 is moved up (in the direction of an arrow Z2) while being held in the corrected state by the holding unit 40, moved toward the second conveyor 20 (toward the downstream side in the direction of an arrow X1) and downward (in the direction of an arrow Z3) as the moving portion 32 moves, and placed and held on a placement portion T0 of a tray T waiting on the second conveyor 20.

Figure 1C:
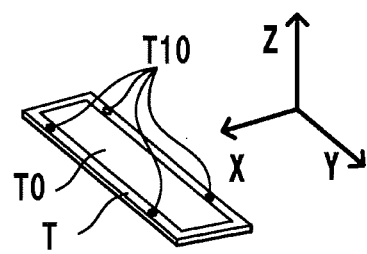
FIG. 1C is a perspective view of a tray T.

As shown in FIG. 1C, the tray T has the placement portion T0 which places the corrected substrate W2 on it by receiving the surface of the substrate W2. The placement portion T0 includes a holding mechanism T10 for holding the corrected substrate W2 in the corrected state. In this embodiment, the holding mechanism T10 includes a regulating member which regulates the reference of the placement position of the corrected substrate W2 on the placement portion T0 by abutting against one side of the corrected substrate W2 in the transverse direction, and a biasing mechanism which abuts against the other opposing side and holds the corrected substrate W2 while biasing it toward the reference member. Furthermore, the corrected substrate W2 is held straight by covering that surface (the surface facing the holding unit 40) of the corrected substrate W2, which is opposite to the placement surface, with a plate-like cover member.

The second conveyor 20 is obtained by connecting a conveyor unit CU21 and a conveyor unit CU22 in series, each of which has the same arrangement as that of the conveyor unit CU11 of the first conveyor 10 and a width different from that of the conveyor unit CU11, and the downstream side (the downstream side in the direction of an arrow Y2) of the second conveyor 20 is connected to a substrate accommodating apparatus. The second conveyor 20 conveys the tray T on which the corrected substrate W2 is placed in the direction of the arrow Y2, and supplies the substrate W2 to the substrate accommodating apparatus. As described above, the transfer apparatus A of this embodiment positions the warped substrate W1 in the predetermined position and corrects the warped substrate W1 by the transport unit 11, and places and holds the corrected substrate W2 on the tray T and conveys the tray T via the transfer unit 30 and second conveyor 20. The first conveyor 10 and transport unit 11 of the transfer apparatus A will be explained in detail below.

<First Conveyor 10>

The first conveyor 10 includes the conveyor unit CU11 arranged on the upstream side in the substrate W conveyance direction, and the transport unit 11 arranged on the downstream side. The first conveyor 10 includes one conveyor unit CU11 in this embodiment, but the present invention is not limited to this, and it is also possible to properly increase or decrease the number of conveyor units CU11 in accordance with the size of the transfer apparatus A. Alternatively, the first conveyor 10 can also directly convey the substrate W from the substrate supply apparatus to the transport unit 11 without using the conveyor unit CU11.

<Conveyor Unit CU11>

The conveyor unit CU11 receives the warped substrate W1 from the substrate supply apparatus (not shown) arranged on the upstream side (the upstream side in the direction of the arrow Y1), and conveys the warped substrate W1 to the transport unit 11 (to the downstream side in the direction of the arrow Y1). The conveyor unit CU11 includes a pair of endless belts EB spaced apart from each other, two pairs of pulleys P over which the endless belts EB are extended, and driving sources 211a and 211b (see FIG. 2) for giving driving forces to the endless belts EB. The pair of endless belts EB are spaced apart by an interval corresponding to the width of the substrate W. That is, the pair of endless belts EB are so arranged as to support the side portions in the widthwise direction (transverse direction) of the substrate W.

One pair of pulleys P are spaced apart from each other in the conveyance direction (Y direction) of the substrate W. The endless belt EB extended over the pair of pulleys P conveys the warped substrate W1 placed on the endless belt EB in the conveyance direction, as a straight portion extending in the conveyance direction of the warped substrate W1 moves in accordance with the rotation of the pulleys P. Note that this embodiment adopts an endless round belt having a circular section as the endless belt EB, but the present invention is not limited to this. For example, it is also possible to adopt an endless belt having a rectangular section, a grooved belt (made of, for example, a resin) having a projection or groove on the inner circumferential surface side of an endless belt wound around a pulley, or a chain made of a resin or metal. Note also that when the endless belt EB is a round belt, a pulley having an arcuate groove can be adopted as the pulley P.

<Transport Unit 11>

The transport unit 11 is connected to the downstream side of the conveyor unit CU11, positions the conveyed warped substrate W1 in the predetermined unloading position, and straightens the warped substrate W1 in cooperation with the holding unit 40. The unloading position is a position in the transport unit 11 when the holding unit 40 unloads the substrate W from the transport unit 11. The transport unit 11 places the warped substrate W1 in the unloading position, corrects the deformation of the warped substrate W1 in cooperation with the holding unit 40, and positions the corrected substrate W2, and the holding unit 40 holds the corrected substrate W2. Consequently, the corrected substrate W2 transferred via the holding unit 40 is accurately placed on the placement portion T0 of the tray T waiting on the second conveyor 20. Details of the transport unit 11 will be explained with reference to FIGS. 2 to 7.

Figure 2:
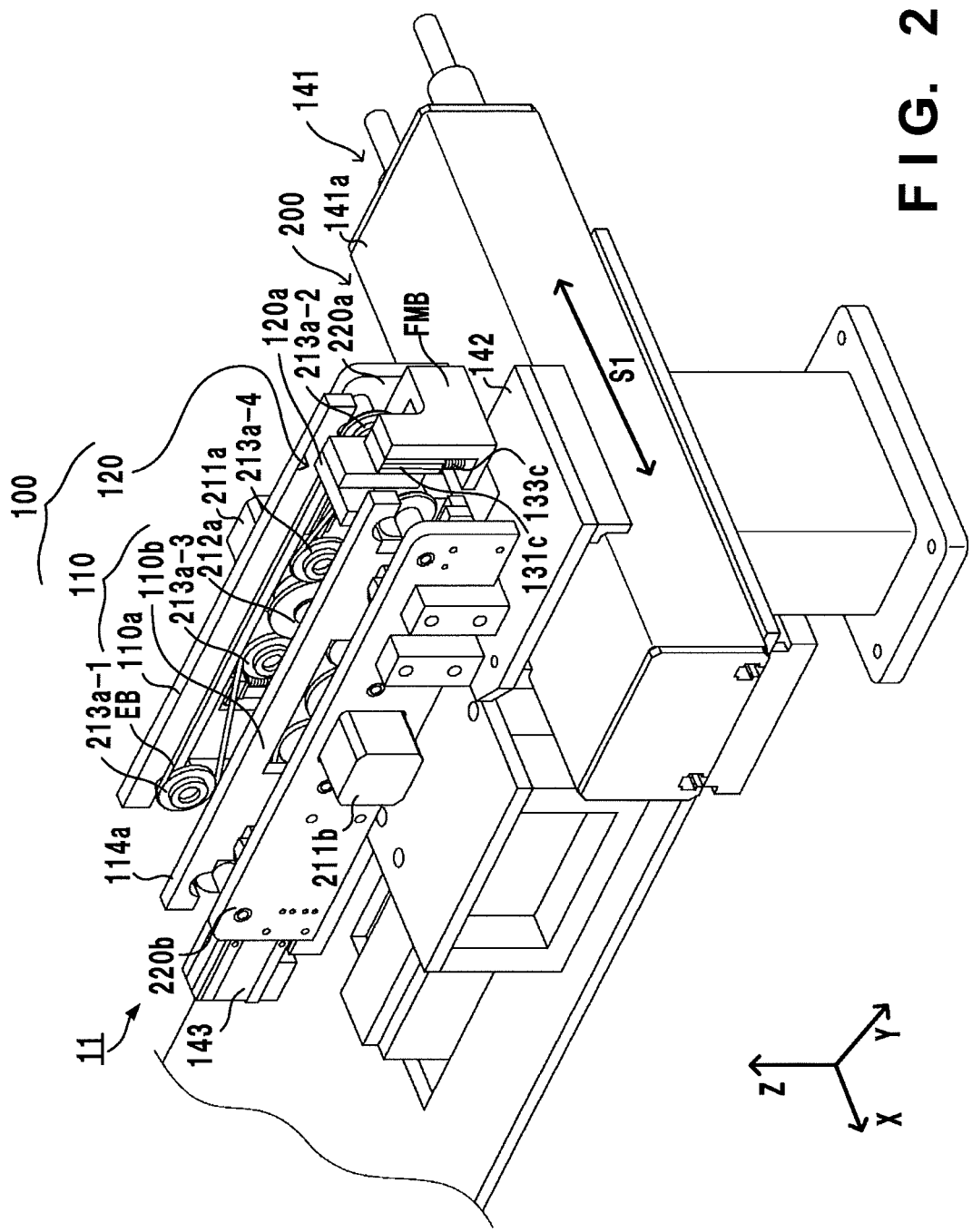
FIG. 2 is a perspective view of a transport unit.

As shown in FIG. 2, the transport unit 11 includes a positioning mechanism 100 for positioning the warped substrate W1 in the unloading position, and a transport mechanism 200 for transporting the warped substrate W1 to the unloading position. Note that the transport unit 11 shown in FIG. 2 is in a state in which a cover 11a covering the exterior of the transport unit 11 shown in FIG. 1A is removed.

<Positioning Mechanism 100>

The positioning mechanism 100 includes regulating members including a side surface regulating member 110 and an end face regulating member 120. The side surface regulating member 110 and end face regulating member 120 each include a pair of regulating portions (to be described later) capable of abutting against the opposing side surfaces and opposing end faces of the warped substrate W1. In this embodiment, therefore, the regulating members include two pairs of regulating portions. The positioning mechanism 100 also includes a regulation moving mechanism 130 (to be described later) capable of moving the regulating portions in a direction in which the substrate W is pressed, and an abutment moving mechanism 140 (to be described later) capable of moving one regulating portion toward the other regulating portion, in accordance with each of the side surface regulating member 110 and end face regulating member 120.

<Side Surface Regulating Member 110>

The side surface regulating member 110 is so arranged as to oppose the two side surfaces of the warped substrate W1 in the widthwise direction (X direction) perpendicular to the transport direction, and to be able to abut against the two side surfaces, and includes a first regulating portion 110a arranged on one side surface side of the warped substrate W1 (on one side in the X direction, on the upper right side in FIG. 2), and a second regulating portion 110b arranged on the other surface side (on the other side in the X direction, on the lower left side in FIG. 2). The side surface regulating member 110 also includes a side surface moving mechanism (abutment moving mechanism) 141 for moving the second regulating portion 110b toward the first regulating portion 110a. In addition, a first transport mechanism 200a and a second transport mechanism 200b are respectively arranged adjacent to the first regulating portion 110a and second regulating portion 110b. The first transport mechanism 200a and second transport mechanism 200b form transport mechanisms in the side surface regulating member 110. Furthermore, a first regulation moving mechanism 130a and a second regulation moving mechanism 130b are respectively arranged adjacent to the first regulating portion 110a and second regulating portion 110b. The first regulation moving mechanism 130a and second regulation moving mechanism 130b form regulation moving mechanisms in the side surface regulating member 110.

<First Regulating Portion 110a>

Figure 3:
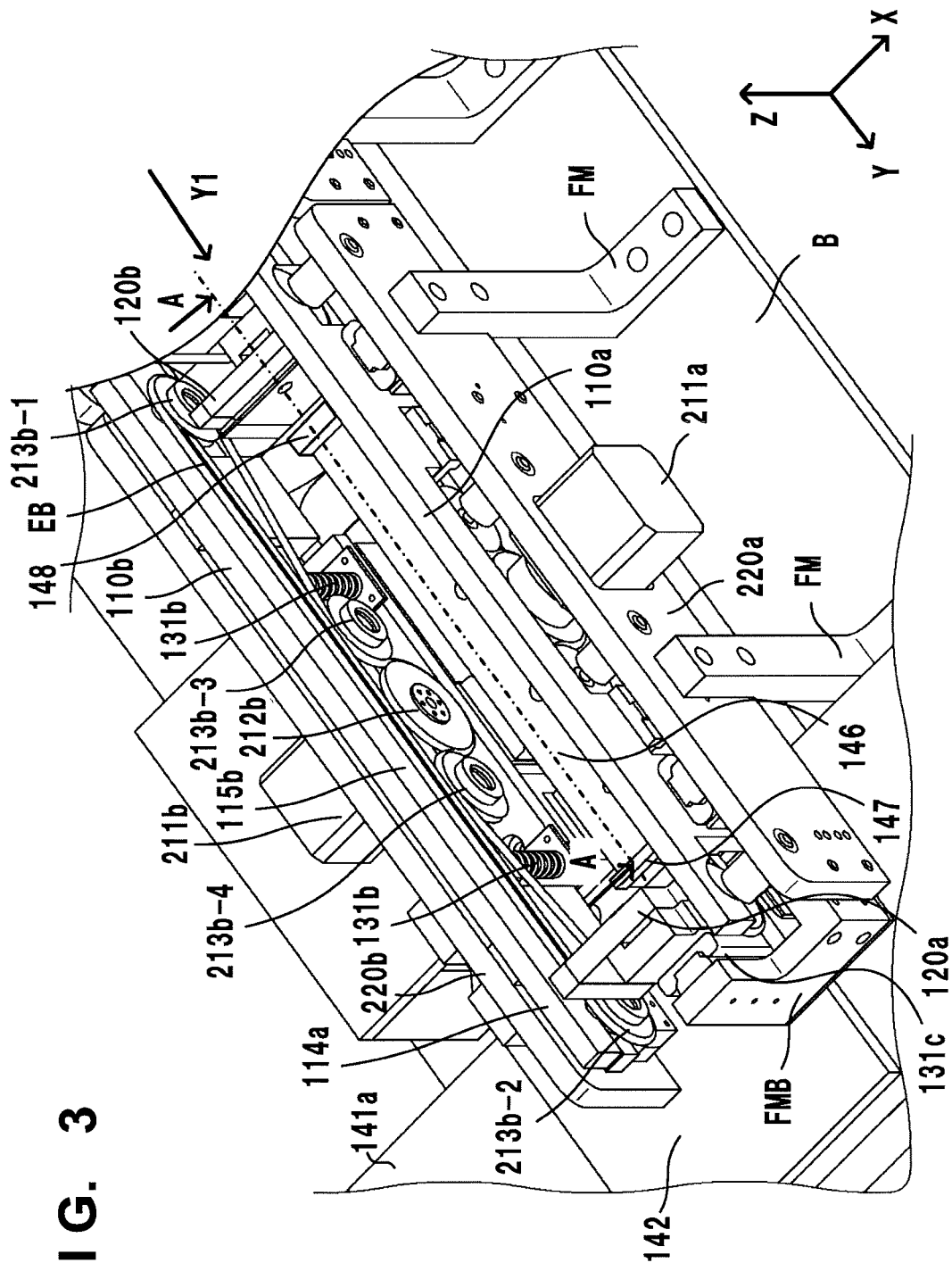
FIG. 3 is a perspective view of the transport unit.
Figure 4:
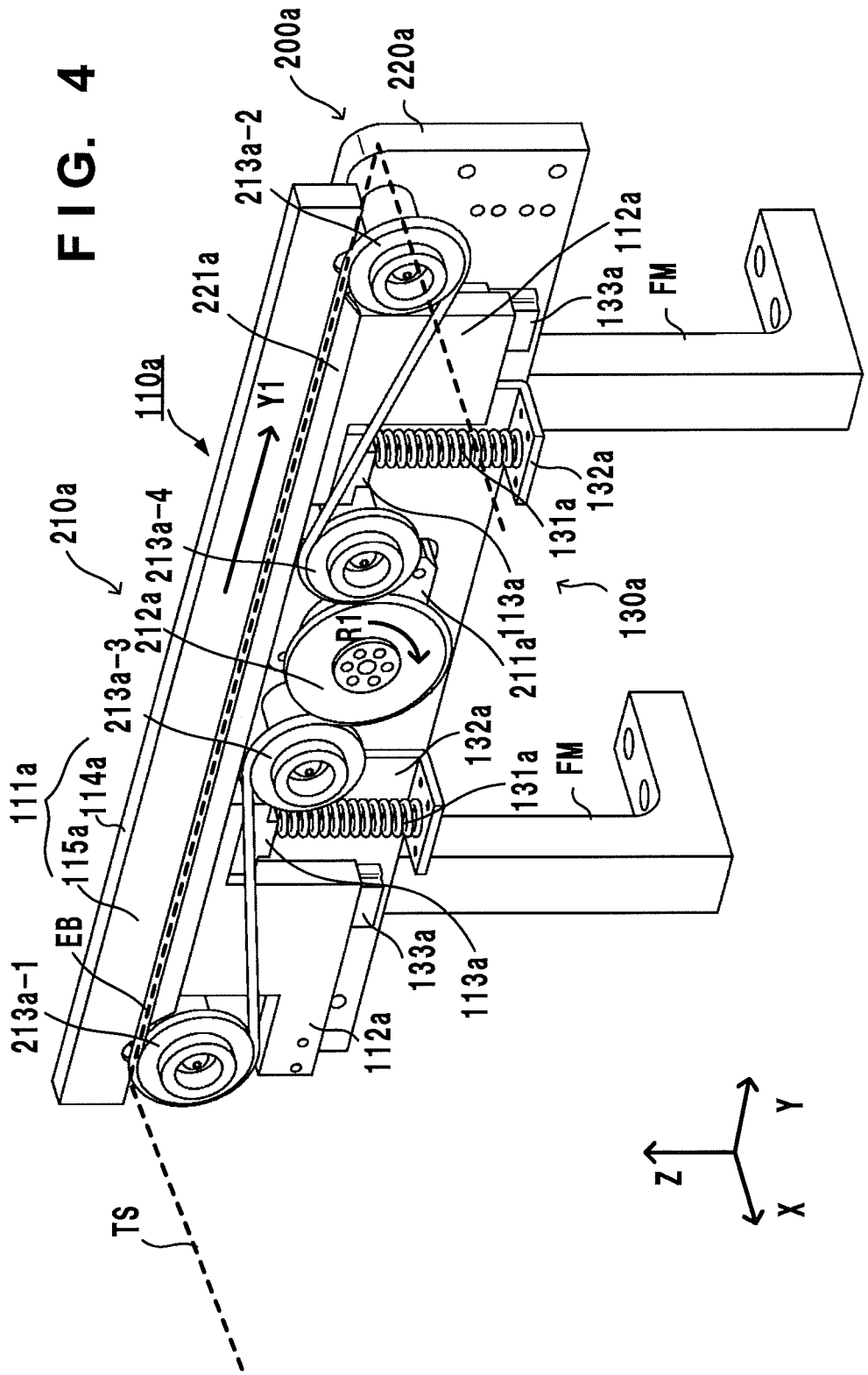
FIG. 4 is a perspective view of a side portion regulating member in the transport unit shown in FIG. 2.

As shown in FIG. 3, the first regulating portion 110a is arranged on the left side when viewed from the upstream side in the conveyance direction Y1 of the warped substrate W1, and fixed on the base B via fixing members FM. Details of the first regulating portion 110a will be explained below with reference to FIGS. 4 to 6. FIG. 4 is a perspective view showing the first regulating portion 110a viewed from the second regulating portion 110b. The first regulating portion 110a shown in FIG. 4 includes the first transport mechanism 200a and first regulation moving mechanism 130a, and can partially project upward from a conveyance surface TS of the substrate W indicated by the dotted lines in FIG. 4. This projecting portion of the first regulating portion 110a regulates one side surface of the warped substrate W1.

<First Transport Mechanism 200a>

The first transport mechanism 200a includes a conveying mechanism 210a for conveying the warped substrate W1 by supporting the lower surface of the warped substrate W1, and a conveyance support member 220a for supporting the conveying mechanism 210a. The conveying mechanism 210a includes the endless belt EB, a driving member 212a connected to the driving source 211a such as a servo motor, and a plurality of (in this embodiment, four) driven members 213a-1, 213a-2, 213a-3, and 213a-4. Note that this embodiment adopts an endless round belt having a circular section as the endless belt EB, but the present invention is not limited to this. For example, it is also possible to adopt an endless belt having a rectangular section, a resin belt having a projection or groove on the inner circumferential surface of an endless belt, or a chain made of a resin or metal. Note also that when the endless belt EB is a round belt, a pulley having an arcuate groove can be adopted as each of the driving member 212a and driven member 213a.

Figure 5:
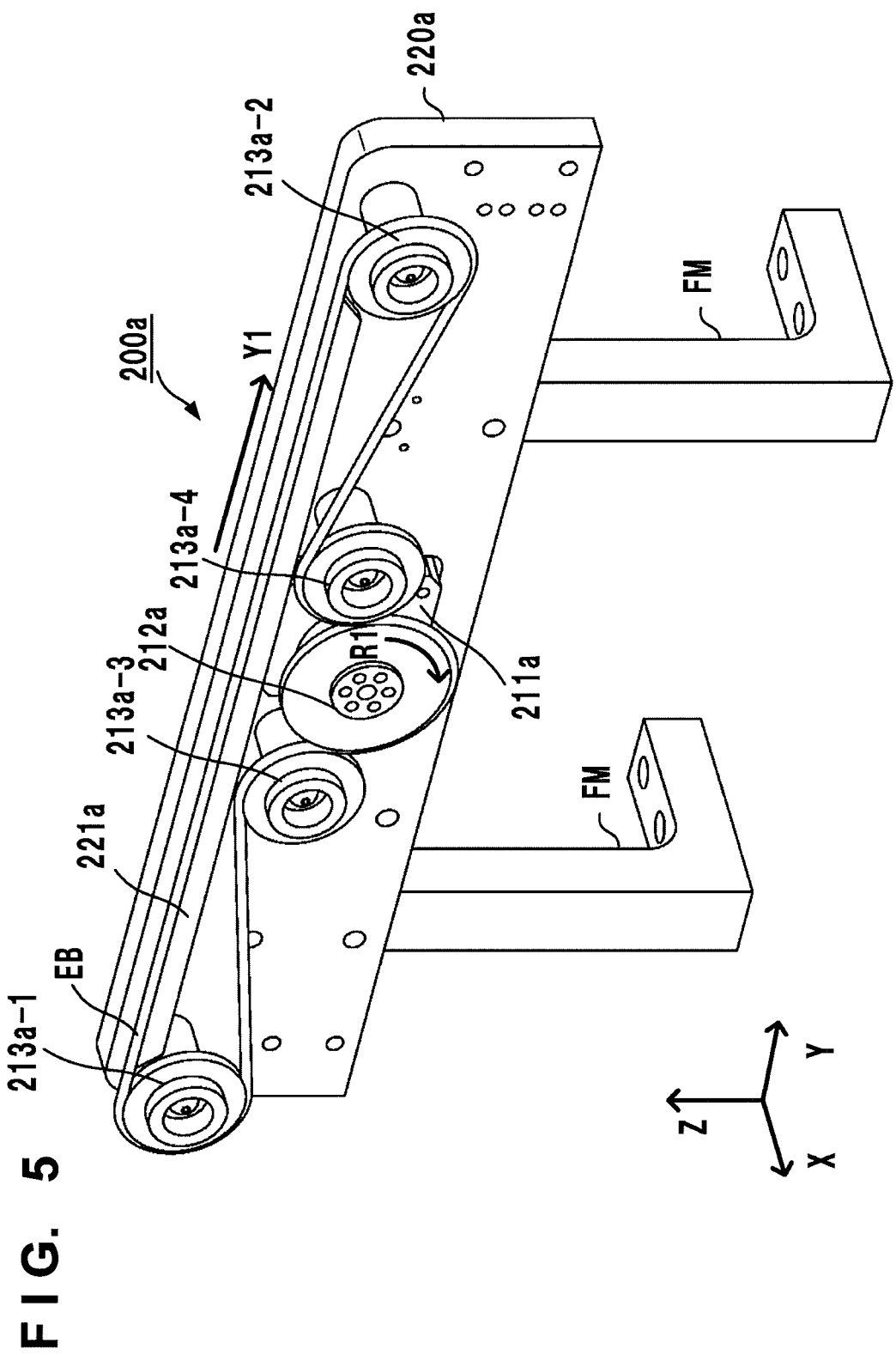
FIG. 5 is a perspective view of a transport mechanism of the side portion regulating member shown in FIG. 4.

FIG. 5 is a perspective view showing the first transport mechanism 200a attached to the fixing members FM by omitting the first regulating portion 110a and first regulation moving mechanism 130a. As shown in FIG. 5, the endless belt EB supporting the side portion lower surface of the warped substrate W1 over the conveyance direction (Y1 direction) is so extended that a straight portion supporting the warped substrate W1 is formed between the pair of driven members 213a-1 and 213a-2 spaced most apart from each other. In this state, the driving member 212a is slidably arranged on the inner circumferential surface of the endless belt EB on the inner circumference side in the central portion in the longitudinal direction of the endless belt EB and on the lower side in the vertical direction. The pair of driven members 213*a*-3 and 213*a*-4 are arranged adjacent to the driving member 212*a* so as to sandwich it from the outside below the annular endless belt EB.

The center of the driving member 212*a* is offset downward in the vertical direction in FIG. 5 from the center of the pair of adjacent driven members 213*a*-3 and 213*a*-4. Accordingly, the endless belt EB is wound with the tension being applied to both the driving member 212*a* and driven member 213*a*. Therefore, the driving member 212*a* driven by the driving source 211*a* is rotated in the direction of an arrow R1 in FIG. 5 (a counterclockwise direction), and the upper straight portion of the endless belt EB is moved in the Y1 direction in FIG. 5. Note that the conveyance support member 220*a* supports the driving source 211*a*, driving member 212*a*, and the plurality of driven members 213*a*. The driving member 212*a* and the plurality of driven members 213*a* are rotatably supported by the conveyance support member 220*a*. Also, the conveyance support member 220*a* includes a support guide portion 221*a* which supports the upper straight portion of the endless belt EB. The support guide portion 221*a* is an elongated member so arranged as to extend in the conveyance direction between the pair of driven members 213*a*-1 and 213*a*-2, and supports the endless belt EB by the upper surface. Note that when the warped substrate W1 is pressed by the holding unit 40, the support guide portion 221*a* supports the substrate W1 via the endless belt EB, and receives the restoring force when the warped substrate W1 is corrected.

<First Regulation Moving Mechanism>

Figure 6:
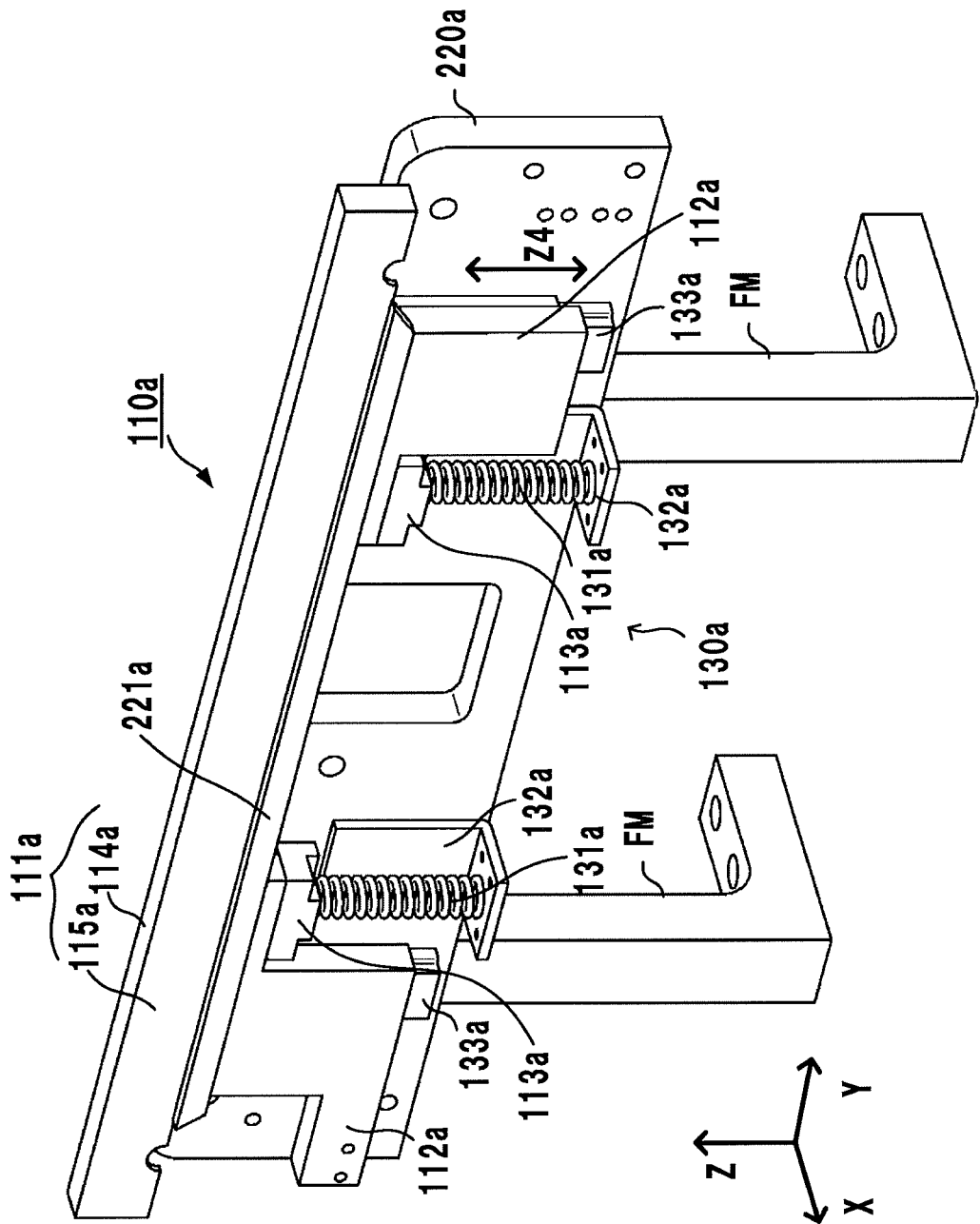
FIG. 6 is a perspective view excluding the transport mechanism from the side portion regulating member shown in FIG. 4.

As shown in FIG. 4, the first regulation moving mechanism 130*a* is arranged between the conveyance support member 220*a* and endless belt EB of the first transport mechanism 200*a*. FIG. 6 is a perspective view showing the first regulating portion 110*a* by omitting the driving source 211*a*, the driving member 212*a*, the plurality of driven members 213*a*, and the endless belt EB of the first transport mechanism 200*a*.

The first regulation moving mechanism 130*a* includes a biasing member 131*a* for biasing and supporting the first regulating portion 110*a* of the side surface regulating member 110, a biasing support member 132*a* which supports the biasing member 131*a* and is attached to the conveyance support member 220*a*, and a guiding mechanism 133*a* for guiding the movement of the first regulating portion 110*a* (the side surface regulating member) in the biasing direction. This embodiment includes a pair of biasing members 131*a*, a pair of biasing support members 132*a*, and a pair of guiding mechanisms 133*a*. The biasing support members 132*a* and guiding mechanisms 133*a* are attached to the conveyance support member 220*a*.

The first regulating portion 110*a* includes a main body 111*a* extending in the conveyance direction (Y direction), a pair of vertical portions 112*a* extending downward in the vertical direction (Z direction) from the main body 111*a*, and a pair of abutting portions 113*a* which abut against the pair of biasing members 131*a*. The main body 111*a* is set to be longer than the length of the corrected substrate W2 in the conveyance direction. An upper surface 114*a* of the main body 111*a* is a flat surface which abuts against the lower surface 40*a* of the holding unit 40 when the warped substrate W1 is pressed (corrected) as will be described later. An inner side surface 115*a* of the main body 111*a*, which opposes the second regulating portion 110*b*, functions as a guide portion for guiding the side surface of the warped substrate W1 conveyed by the first transport mechanism 200*a*. The inner side surface 115*a* also functions as a positioning portion for positioning the warped substrate W1 by abutting against the side surface of the warped substrate W1, when the second regulating portion 110*b* (to be described later) moves toward the first regulating portion 110*a*. The inner side surface 115*a* is appropriately set to have a dimension corresponding to the warpage height (a warpage dimension in the warpage direction) of the warped substrate W1.

The conveyance support member 220*a* includes the guiding mechanism 133*a* on a side surface opposing the second regulating portion 110*b*. An example of the guiding mechanism 133*a* is a rail which guides the first regulating portion 110*a* in the vertical direction (top-to-bottom direction) in cooperation with the vertical portion 112*a* of the first regulating portion 110*a*. For example, the guiding mechanism 133*a* can be a rail which includes a recessed groove corresponding to a projecting shape formed on the vertical portion 112*a* of the first regulating portion 110*a*, and extends in the vertical direction. By being guided by the guiding mechanism 133*a*, the first regulating portion 110*a* can move in a Z4 direction (the vertical direction) in FIG. 6 with respect to the conveyance support member 220*a*.

When biased by the biasing member 131*a*, the first regulating portion 110*a* is biased upward in the vertical direction and maintained in a predetermined position if there is no load. It is also possible to form a stopper (not shown) on the guiding mechanism 133*a*, and prevent the first regulating portion 110*a* from moving up or down by a predetermined amount or more. The biasing support member 132*a* for supporting the biasing member 131*a* is a plate-like member having an L shape when viewed sideways, and has one side fixed to the conveyance support member 220*a*, and the other side which supports one end portion of the biasing member 131*a*. A portion of the biasing support member 132*a* opposes the abutting portion 113*a* of the first regulating portion 110*a*. The biasing member 131*a* is accommodated between the abutting portion 113*a* and biasing support member 132*a* when the end portion of the biasing member 131*a* abuts against the abutting portion 113*a* of the first regulating portion 110*a*. Accordingly, the regulation moving mechanism 130 includes the biasing member (biasing mechanism) 131*a* having the biasing force which biases the first regulating portion 110*a* in a direction (one direction) opposite to the direction in which the first regulating portion 110*a* is pressed by the holding unit 40. Note that an example of the biasing member 131*a* is a coil spring, but the present invention is not limited to this, and it is also possible to adopt, for example, a leaf spring, or an elastic resin member which returns to its original state even if it is compressed by a predetermined amount.

As described above, the first regulating portion 110*a* functions as a guide portion when the warped substrate W1 conveyed from the conveyor unit CU1 1 is conveyed to a predetermined position in the transport unit 11. In this case, the inner side surface 115*a* of the first regulating portion 110*a* guides the side surface of the warped substrate W1 conveyed by the endless belt EB of the first transport mechanism 200*a*. When the holding unit 40 is moved down toward the warped substrate W1, the lower surface 40*a* of the holding unit 40 abuts against the upper surface 114*a* of the main body 111*a* of the first regulating portion 110*a*. When the holding unit 40 is kept moved down, the guiding mechanism 133*a* of the regulation moving mechanism 130 allows the first regulating portion 110*a* (a regulating member) to move in the direction in which the warped substrate W1 is pressed. The holding unit 40 moves down the first regulating portion 110*a* by pressing it, and corrects the warped substrate W1 by pressing it. When the correction of the warped substrate W1 is complete, the holding unit 40 starts rising while holding the corrected substrate W2. In this state, the first regulating portion 110a is biased by the biasing member 131a. Therefore, when the rise of the holding unit 40 cancels the pressing of the first regulating portion 110a, the first regulating portion 110a can start rising by the biasing force of the biasing member 131a so as to return to the original state again.

<Second Regulating Portion 110b>

The second regulating portion 110b will be explained with reference to FIGS. 2 and 3. While the first regulating portion 110a is fixed on the base B via the fixing members FM, the second regulating portion 110b is movable relative to the base B via the abutment moving mechanism 140 and side surface moving mechanism 141. The second regulating portion 110b includes a positioning mechanism 100b and the second transport mechanism 200b in positions symmetrical to the center between the first regulating portion 110a and transport unit 11. Note that the positioning mechanism 100b and second transport mechanism 200b of the second regulating portion 110b are members having the same shapes as those of the positioning mechanism 100a and first transport mechanism 200a of the first regulating portion 110a. In FIGS. 2 and 3, therefore, b is attached, instead of a, as a reference symbol to the ends of the reference numerals of the same members of the second regulating portion 110b as those of the first regulating portion 110a.

The side surface moving mechanism 141 includes a moving body 142 to which the second regulating portion 110b is attached, and a widthwise moving mechanism 141a which slidably supports the moving body 142. A known mechanism can be adopted as the widthwise moving mechanism 141a. For example, the widthwise moving mechanism 141a can be configured by a driving source such as a motor, and a transmitting mechanism (for example, a belt transmitting mechanism, ball-screw mechanism, or rack-pinion mechanism) for transmitting the driving force of the driving source. The widthwise moving mechanism 141a is fixed on the base B, and can move the moving body 142 back and forth in an S1 direction parallel to the X direction shown in FIG. 2. By being fixed to the moving body 142, therefore, the second regulating portion 110b can move closer to or away from (in the X direction) the first regulating portion 110a as the moving body 142 moves.

In the arrangement as described above, the second regulating portion 110b is set to be equal to the conveyance width of the conveyor unit CU11. This makes it possible to guide the two side surfaces of the warped substrate W1, and convey the warped substrate W1 from the conveyor unit CU11 to the transport unit 11. Also, the substrate W2 conveyed into the transport unit 11 and corrected by pressing is moved by pressing toward the first regulating portion 110a by the movement of the second regulating portion 110b in the widthwise direction. Consequently, the side surfaces of the corrected substrate W2 abut against the inner side surface 115a of the first regulating portion 110a and an inner side surface 115b of the second regulating portion 110b, thereby achieving positioning of the corrected substrate W2 in the X direction and posture setting of the corrected substrate W2 in the Y direction (in this posture, the side surfaces of the substrate W are parallel to the Y direction).

<End Face Regulating Member 120>

As shown in FIGS. 2 and 3, the end face regulating member 120 is arranged between the first regulating portion 110a and second regulating portion 110b. The end face regulating member 120 includes a third regulating portion 120a and a fourth regulating portion 120b which oppose the two end faces of the warped substrate W1 in the transport direction (the Y direction in FIG. 2) and can abut against the end faces. In this embodiment, the third regulating portion 120a is arranged on the downstream side in the conveyance direction of the warped substrate W1, and the fourth regulating portion 120b is arranged on the upstream side. The fourth regulating portion 120b can be moved in the conveyance direction of the warped substrate W1 by an end face moving mechanism 143.

The third regulating portion 120a of the end face regulating member 120 is formed on the conveyance support member 220a by a fixing member FMB via a guiding mechanism 131c attached to the fixing member FMB, and a biasing member 133c for biasing the third regulating portion 120a upward. An example of the guiding mechanism 131c includes two members, one member is fixed to the third regulating portion 120a, the other member is fixed to the fixing member FM, and the two members can slide in the Z direction (vertical direction). More specifically, it is possible to adopt a mechanism similar to the guiding mechanism 133a of the first regulating portion 110a.

An example of the biasing member 133c is a coil spring having one end fixed to the third regulating portion 120a, and the other end fixed to the fixing member FMB, and arranged between them. Accordingly, the third regulating portion 120a is always biased upward in the Z direction (vertical direction) and maintained in this state by the biasing member 133c if there is no load, and prevented from projecting by a predetermined amount or more by a stopper (not shown) of the guiding mechanism 131c. Note that the height of the upper end face of the third regulating portion 120a is set at the same height as that of the upper surface 114a of the first regulating portion 110a and an upper surface 114b of the second regulating portion 110b (this height is higher than the abutting height of the front end face of the warped substrate W1 in the transport direction), and the projection amount is set by the guiding mechanism 131c.

Figure 7:
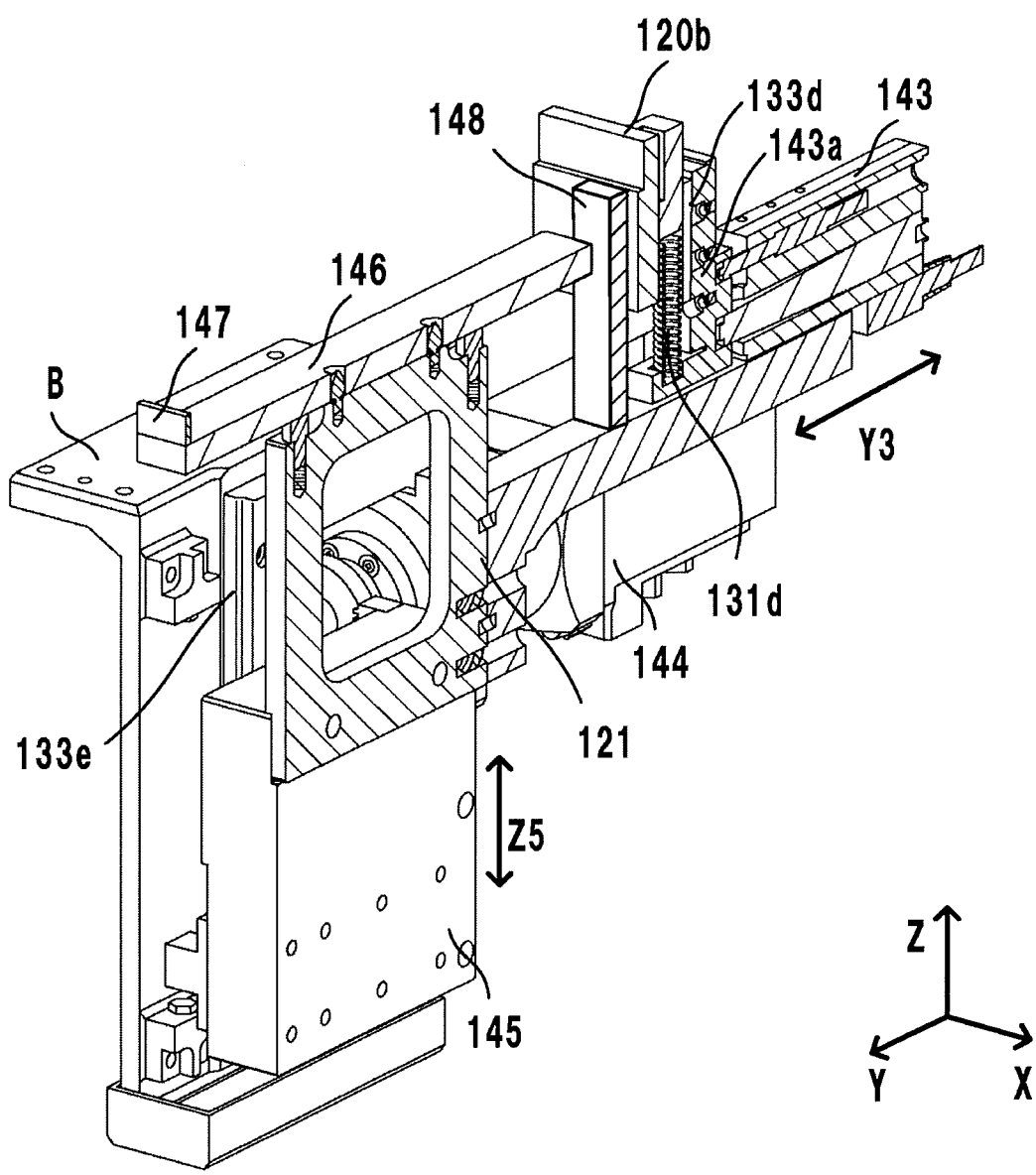
FIG. 7 is a partially cutaway perspective view of an end portion regulating member and regulation moving mechanism in the transport unit shown in FIG. 2.

As shown in FIG. 3, the fourth regulating portion 120b waits below the conveyance surface TS when the warped substrate W1 is loaded into the transport unit 11. When the warped substrate W1 abuts against the third regulating portion 120a, the fourth regulating portion 120b is moved above the conveyance surface TS by the rise of an elevator 145 driven by an elevation driving unit 144 (to be described later). FIG. 7 is a perspective view showing an A-A section obtained by cutting the fourth regulating portion 120b including the elevation driving unit 144 in the center of the fourth regulating portion 120b in the X direction in parallel to the Y direction shown in FIG. 2.

The fourth regulating portion 120b includes a guiding mechanism 133d attached to a movable portion 143a of the end face moving mechanism 143, and a biasing member 131d for biasing the fourth regulating portion 120b upward. A known mechanism can be adopted as the end face moving mechanism 143. For example, the end face moving mechanism 143 can be configured by a driving source such as a motor, and a transmitting mechanism (for example, a belt transmitting mechanism, ball-screw mechanism, or rack-pinion mechanism) for transmitting the driving force of the driving source. An example of the guiding mechanism 133d includes two members, one member is fixed to the fourth regulating portion 120b, the other member is fixed to the movable portion 143, and the two members can slide in the Z direction (vertical direction). More specifically, it is possible to adopt a mechanism similar to the guiding mechanism 133a of the first regulating portion 110a.

An example of the biasing member 131d is a coil spring having one end fixed to the fourth regulating portion 120b, and the other end fixed to the movable portion 143a, and arranged between them. Accordingly, the fourth regulating portion 120b is always biased upward in the Z direction (vertical direction) and maintained in this state by the biasing member 131d if there is no load, and prevented from projecting by a predetermined amount or more by a stopper (not shown) of the guiding mechanism 133d. Note that the height of the upper end face of the fourth regulating portion 120b is set at the same height as that of the upper surface 114a and upper surface 114b of the first regulating portion 110a and second regulating portion 110b (this height is higher than the abutment height of the rear end face of the warped substrate W1 in the transport direction) when this upper end face projects above the conveyance surface TS, and the projection amount is set by the guiding mechanism 133d.

The end face moving mechanism 143 is fixed to a fourth main body 121 fixed to the elevator 145. Therefore, when the movable portion 143a of the end face moving mechanism 143 moves relative to the fourth main body 121 in the conveyance direction (a Y3 direction in the drawing) parallel to the Y direction, the fourth regulating portion 120b can move relative to the fourth main body 121. The elevator 145 is so supported as to be vertically movable with respect to the base B by the elevation driving unit 144 and a guiding mechanism 133e fixed on the base B. An example of the elevation driving unit 144 is a servo motor including a pinion, and an example of the elevator 145 is a member including a rack engaged with the pinion. The guiding mechanism 133e is so arranged as to extend parallel to the vertical direction.

An example of the guiding mechanism 133e includes two members, one member is fixed to the elevator 145, the other member is fixed to the base B, and the two members can slide in the Z direction (vertical direction). More specifically, it is possible to adopt a mechanism similar to the guiding mechanism 133a of the first regulating portion 110a. When the pinion of the elevation driving unit 144 pivots, the elevator 145 including the rack which engages with the pinion can move in the top-to-bottom direction of the base B by being guided by the guiding mechanism 133e.

The fourth main body 121 includes a support member 146 which is arranged between the third regulating portion 120a and fourth regulating member 120b, and supports the lower surface of the warped substrate W1. The support member 146 is an elongated member which extends along the conveyance direction (Y direction) of the substrate W by nearly the same length as that of the substrate W in the Y direction. A first end support portion 147 which abuts against the end portion lower surface of the warped substrate W1 on the downstream side in the conveyance direction is arranged on the upper surface end portion of the support member 146 on the downstream side in the conveyance direction. In addition, a second end support portion 148 which abuts against the end portion lower surface of the warped substrate W1 on the upstream side in the conveyance direction is arranged between the fourth regulating portion 120b and support member 146. The vertical movement of the elevator 145 driven by the elevation driving unit 144 moves the support member 146 between a support position where the support member 146 supports the warped substrate W1, and a non-support position which is below the support position and spaced apart from the warped substrate W1. Note that the first end support portion 147 and second end support portion 148 contribute to positioning of the ward substrate W1 by abutting against the two end portion lower surfaces of the warped substrate W1 in the conveyance direction.

<Control Unit>

Figure 8:
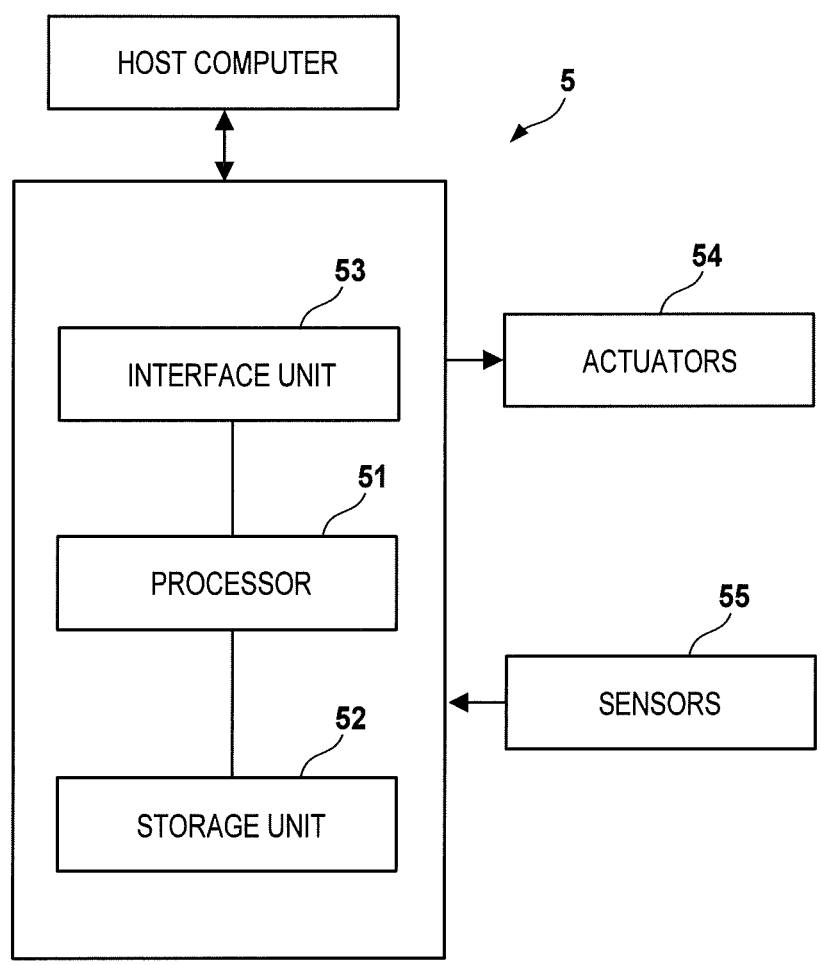
FIG. 8 is a block diagram of a control unit.

FIG. 8 is a block diagram of a control unit 5 of the transfer apparatus A. The control unit 5 controls the whole transfer apparatus A. The control unit 5 includes a processor 51 such as a CPU, a storage unit 52 such as a RAM or ROM, and an interface unit 53 which interfaces an external device and the processor 51 with each other. The interface unit 53 includes an I/O interface, and a communication interface which communicates with a host computer. The host computer may also be, for example, a computer which controls the whole substrate supply apparatus and substrate accommodating apparatus.

The processor 51 executes a program stored in the storage unit 52, and controls the sensing results of various sensors 55 and various actuators 54. The various sensors 55 include, for example, sensors for sensing the positions of the driving sources 211a and 211b and elevation driving unit 144, and a sensor (to be described later) for sensing the position of the warped substrate W1 in the transport unit 11. The various actuators 54 include, for example, the driving sources 211a and 211b, driving sources of the elevation driving unit 144, and a pump and control valve for controlling the air quantity to be blown and performing negative pressure suction in the positive pressure/negative pressure controller 42. The control unit 5 controls, for example, the transport unit 11 (to be described later), and performs first operation control of causing the abutment moving mechanism to move the regulating member to a first position for regulating the work range, and second operation control of causing the abutment moving mechanism to move the regulating member to the substrate positioning position.

<Control Example>

Figure 9E:
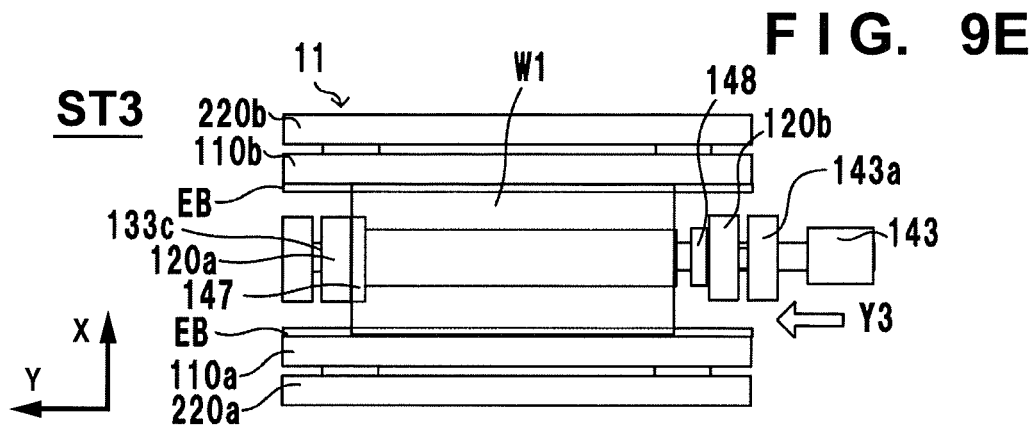
FIG. 9E is a view for explaining the operation of the transfer apparatus in state ST3.

An operation control example of the transport unit 11 will be explained with reference to FIGS. 9A to 9P. In this example, operations of positioning and correcting the warped substrate W1 will be explained. More specifically, an example in which the warped substrate W1 loaded into the transport unit 11 is positioned by the transport unit 11 and the substrate W2 pressed and corrected by the holding unit 40 is unloaded from the transport unit 11 will be explained. Note that FIGS. 9A, 9C, 9E, 9G, 9I, 9K, 9M, and 9O are plan views showing the transport unit 11 from above, and FIGS. 9B, 9D, 9F, 9H, 9J, 9L, 9N, and 9P are schematic sectional views showing the transport unit 11 cut in a plane extending in the conveyance direction.

State ST1 shown in FIGS. 9A and 9B is the way the warped substrate W1 is loaded into the transport unit 11 from the conveyor unit CU11 shown in FIG. 1. As shown in FIG. 9B, the fourth regulating portion 120b is in a standby position below the conveyance surface TS. Note that in each drawing to be explained below, the right side in the drawing is the upstream side in the conveyance direction, and the left side in the drawing is the downstream side in the conveyance direction.

As shown in FIG. 9A, when the warped substrate W1 is loaded into the transport unit 11, the second regulating portion 110b is moved to a position corresponding to the width of the substrate W in the direction of the arrow S1 toward the first regulating portion 110a. In this state, the distance between the first regulating portion 110a and second regulating portion 110b is set to correspond to a dimension slightly larger than the width of the substrate W (a dimension which allows the warped substrate W1 to be supported and transported by the pair of endless belts EB).

State ST2 shown in FIGS. 9C and 9D is a state in which the warped substrate W1 is conveyed to abut against the third regulating portion 120a. A position sensor (not shown)

is arranged near the third regulating portion 120*a*, and senses that the warped substrate W1 has arrived at the third regulating portion 120*a*. After that, as shown in FIG. 9D, the fourth regulating portion 120*b* rises in the direction of an arrow Z5 so as to determine the first position of each regulating portion which regulates a work range (first operation control). The work range is a range which defines the moving range of the substrate W until correction is complete. Therefore, the warped substrate W1 in the middle of the correction work is corrected by each regulating portion so as to be movable in a direction parallel to the conveyance surface within a predetermined work range. Since the warped substrate W1 can thus be corrected, it is possible to reduce the movement load on the warped substrate W1, which occurs during the correction work.

As shown in FIG. 9D, a height dimension D1 of the first regulating portion 110*a* and second regulating portion 110*b* (regulating members) projecting from the conveyance surface TS is set to be larger than a maximum deformation dimension (warpage dimension) D2 of the warped substrate W1. Also, the height dimension D1 of the first regulating portion 110*a* and second regulating portion 110*b* (regulating members) projecting from the conveyance surface TS with the warped substrate W1 being corrected is about a dimension by which the first regulating portion 110*a* and second regulating portion 110*b* are abutting against the lower surface 40*a* of the holding unit 40 in a state in which the lower surface 40*a* has corrected the substrate W1 (a state in which pressing is complete). That is, the height dimension D1 of the first regulating portion 110*a* and second regulating portion 110*b* (regulating members) projecting from the conveyance surface TS when the substrate W1 is corrected is slightly larger than (nearly equal to) the thickness of the substrate W1. The dimensions D1 and D2 are appropriately set in accordance with the substrate W as an object. Note that in this embodiment, the planar shape of the substrate W1 is an oblong shape extending in the conveyance direction, so deformation of the substrate W1 occurs such that the two end portions of the substrate W1 in the longitudinal direction approach each other, and almost no deformation occurs in the transverse direction of the substrate W1.

Figure 9F:
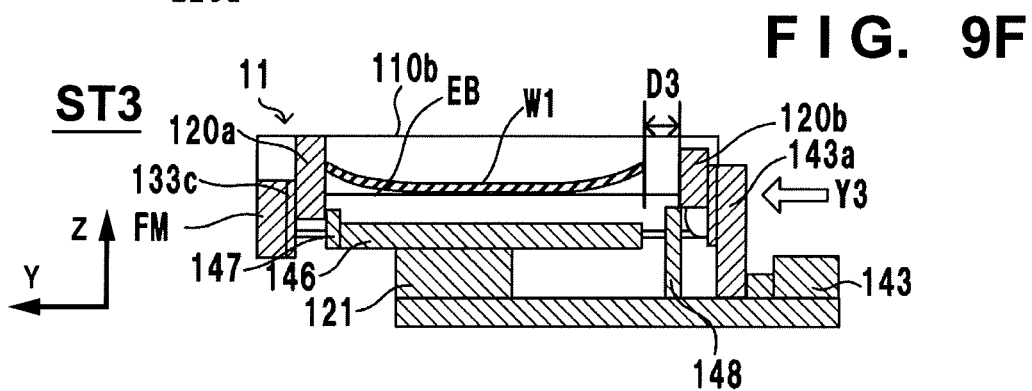
FIG. 9F is a view for explaining the operation of the transfer apparatus in state ST3.

State ST3 shown in FIGS. 9E and 9F is a state in which the warped substrate W1 is transported to the unloading position, and transported to the work range regulated by the first regulating portion 110*a* and second regulating portion 110*b*. In this state, the fourth regulating portion 120*b* (one regulating member) causes the third regulating portion 120*a* (the other regulating member) to project the upper surface from the conveyance surface TS to a position slightly lower than the upper surfaces of the first regulating portion 110*a* and second regulating portion 110*b* and to wait, and moves in the direction of an arrow Y3 so as to approach the third regulating portion 120*a* (the other regulating portion) from the upstream side in the conveyance direction, thereby setting the work range of correction in the conveyance direction (a setting step). In this embodiment, based on the contour of the substrate W which is not curved but straight, a work range for the substrate W1 is set (this work range is slightly larger than the contour of the straight substrate W). By taking account of a length D3 by which the warped substrate W1 extends in the conveyance direction after being corrected, the distance between the third regulating portion 120*a* and fourth regulating portion 120*b* is set at a distance longer than the length by which the warped substrate W1 extends.

Note that in state ST3, the first end support portion 147 and second end support portion 148 having risen from state ST2 wait in a position lower than the bottom surface of the warped substrate W1 (that is, a position slightly lower than the conveyance surface TS). In this state, therefore, the first end support portion 147 and second end support portion 148 do not abut against the bottom surface of the warped substrate W1.

Figure 9G:
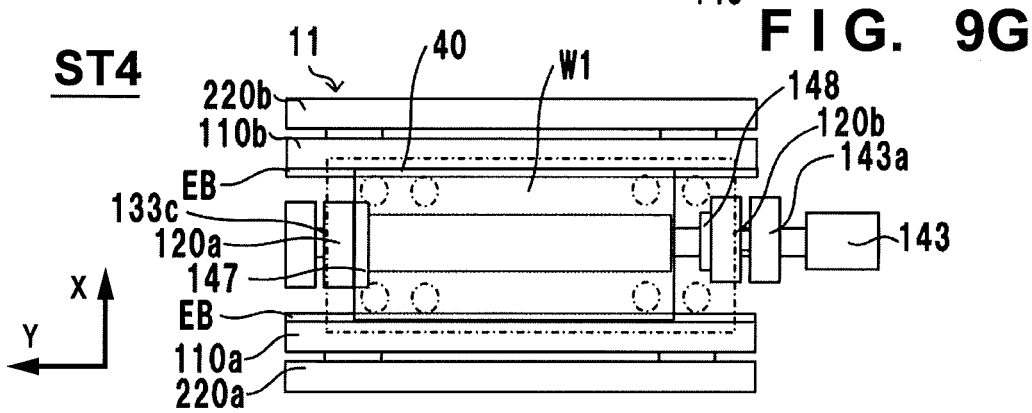
FIG. 9G is a view for explaining the operation of the transfer apparatus in state ST4.
Figure 9H:
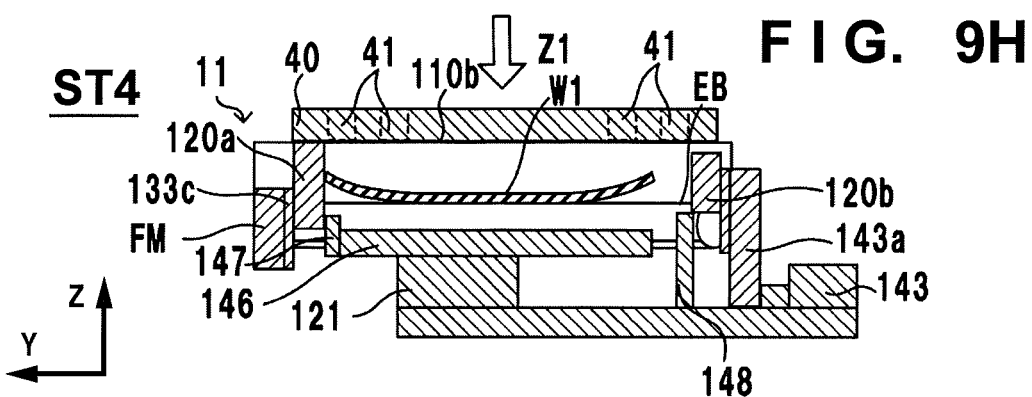
FIG. 9H is a view for explaining the operation of the transfer apparatus in state ST4.

State ST4 shown in FIGS. 9G and 9H is a state in which the holding unit 40 moves to the substrate unloading position after the first regulating portion 110*a*, second regulating portion 110*b*, third regulating portion 120*a*, and fourth regulating portion 120*b* have moved to the work range. In this state, the first regulating portion 110*a*, second regulating portion 110*b*, third regulating portion 120*a*, and fourth regulating portion 120*b* are positioned in the regulation positions in a horizontal plane parallel to the conveyance surface TS, and this defines the work range of correction for the warped substrate W1. As shown in FIG. 9H, the holding unit 40 having moved down toward the warped substrate W1 in the Z1 direction first abuts against the upper surfaces of the first regulating portion 110*a*, second regulating portion 110*b*, and third regulating portion 120*a*.

Figure 9I:
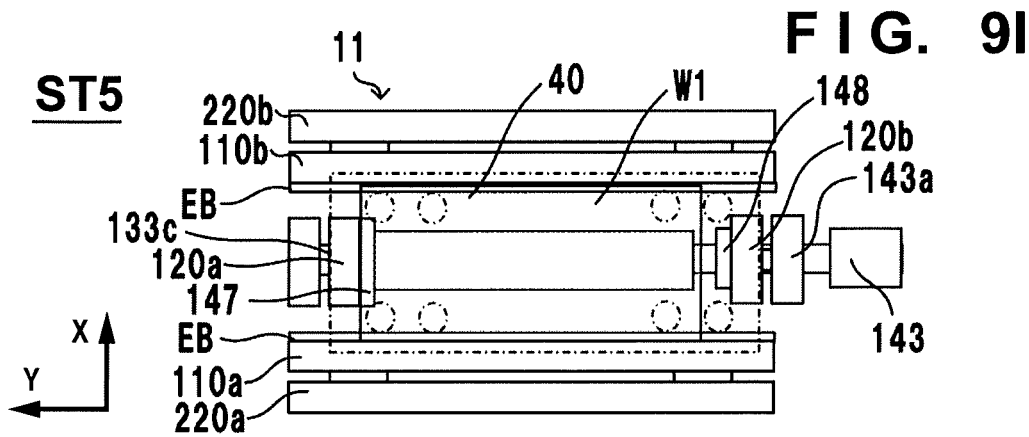
FIG. 9I is a view for explaining the operation of the transfer apparatus in state ST5.
Figure 9J:
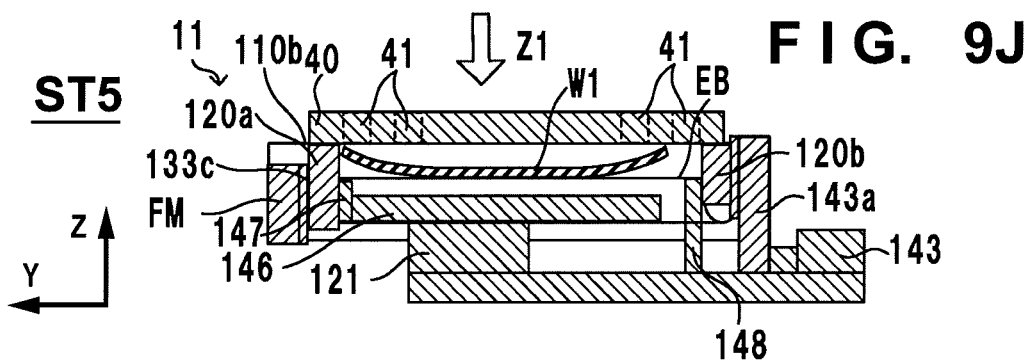
FIG. 9J is a view for explaining the operation of the transfer apparatus in state ST5.

State ST5 shown in FIGS. 9I and 9J is a state in which as the holding unit 40 moves down, the first end support portion 147 and second end support portion 148 further rise to positions where they abut against the warped substrate W1. The upper surface of the fourth regulating portion 120*b* also rises to almost the same height (level) as that of the upper surfaces of the first regulating portion 110*a*, second regulating portion 110*b*, and third regulating portion 120*a*. The warped substrate W1 can be corrected in the transverse direction because the first end support portion 147 and second end support portion 148 can support the end portions in the conveyance direction of the warped substrate W1 from below. As shown in FIG. 9J, the holding unit 40 presses and moves the first regulating portion 110*a*, second regulating portion 110*b*, third regulating portion 120*a*, and fourth regulating portion 120*b* in the direction of the arrow Z1 against the biasing forces of the biasing members (131*a*, 133*c*, and 133*d*). In this state, the holding unit 40 moves down while blowing air from the suction portions 41. When the holding unit 40 corrects the warped substrate W1 by pressing it, therefore, the contact resistance (friction) between the suction portions 41 of the holding unit 40 and the contact surface of the warped substrate W1 can be reduced (deformation of the suction portions 41 can be prevented), so the warped substrate W1 can move within the work range of the correction work. Then, the holding unit 40 starts correcting and unloading the warped substrate W1.

Figure 9K:
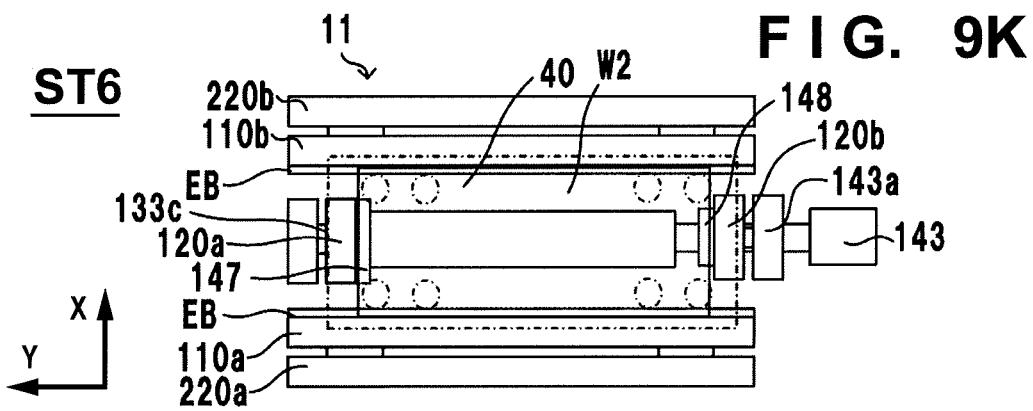
FIG. 9K is a view for explaining the operation of the transfer apparatus in state ST6.
Figure 9L:
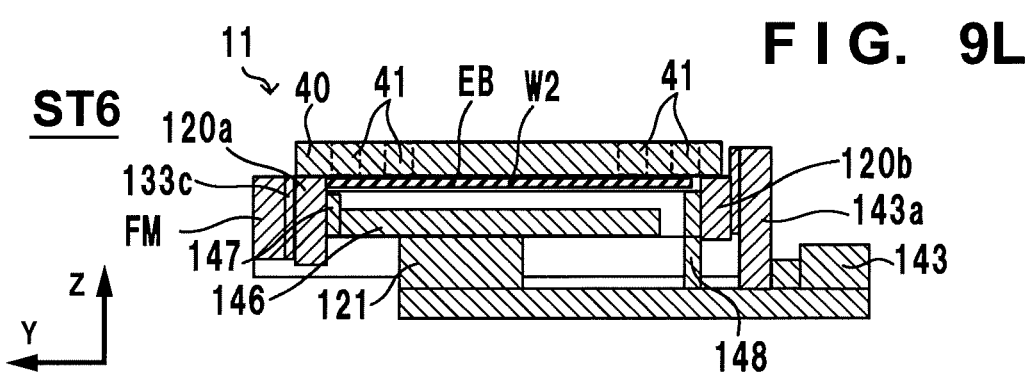
FIG. 9L is a view for explaining the operation of the transfer apparatus in state ST6.

State ST6 shown in FIGS. 9K and 9L is a state in which the warpage of the warped substrate W1 is corrected by the pressing operation of the lower surface 40*a* of the holding unit 40. As shown in FIG. 9L, the corrected substrate W2 is nearly sandwiched (not completely sandwiched) between the lower surface 40*a* of the holding unit 40 and the first end support portion 147, the second end support portion 148, and the pair of endless belts EB.

After the movement of the holding unit 40 in the vertical direction (Z direction) is stopped, each regulating portion is further moved to the positioning position, and the substrate W is finally positioned (second operation control). That is, while the holding unit 40 is pressing the corrected substrate W2, the corrected substrate W2 is moved within the work range in a direction parallel to the substrate surface by the movement of the regulating portions (an operation in which the opposing regulating portions move closer to each other) (in this embodiment, the second regulating portion 110*b* and fourth regulating portion 120*b* arranged to oppose the first regulating portion 110a and third regulating portion 120a as the positioning references are moved toward the first regulating portion 110a and third regulating portion 120a), thereby positioning the corrected substrate W2 in a predetermined position (a positioning movement step). In this step, the holding unit 40 performs the work while blowing air from the suction portions 41.

State ST7 shown in FIGS. 9M and 9N is a state in which the holding unit 40 holds the substrate W by suction and starts unloading the substrate W. By setting a negative pressure in the suction portions 41 of the holding unit 40, the corrected substrate W2 is held by suction in the corrected state by the suction portions 41. The suction portions 41 elastically deform by holding the correction substrate W2 by suction, and contract and move (retract) inside the holding unit 40 from the lower surface 40a. Since the suction portions 41 move inside the holding unit 40 from the lower surface 40a, the upper surface of the corrected substrate W2 is held in tight contact with the lower surface 40a. When a holding sensor (not shown) installed in the holding unit 40 confirms the holding of the substrate W, the holding unit 40 can move together with the corrected substrate W2. Also, when the holding sensor confirms the holding of the corrected substrate W2, the positioning of the corrected substrate W2 by the regulating portions is canceled. After the positioning is canceled, therefore, the holding unit 40 can start rising and start transferring the substrate W.

When the holding unit 40 rises in the direction of the arrow Z2 as shown in FIG. 9N, each regulating portion biased downward by the holding unit 40 is risen in the direction of the arrow Z2 and supported by being biased in a predetermined position by the biasing force of each biasing member. Note that the fourth regulating portion 120b may also be moved down in the direction of the arrow Z5 simultaneously with the rise of the holding unit 40, and at the same time moved away from the third regulating portion 120a in the direction of an arrow Y4. This makes it possible to efficiently perform, for example, the operation of loading the warped substrate W1 to be loaded next into the transport unit 11, and the work of regulating the work range.

State ST8 shown in FIGS. 9O and 9P is a state in which the holding unit 40 has risen in the direction of the arrow Z2. The holding unit 40 transfers the corrected substrate W2 held by suction to a predetermined place (a transfer step). Simultaneously with (or after) the rise of the holding unit 40, the fourth regulating portion 120b is moved below the conveyance surface TS and away from the third regulating portion 120a, and waits in a predetermined standby position. The second regulating portion 110b is also slightly moved away from the first regulating portion 110a, and waits in a guide position for substrate transport. When the regulating portions are thus moved to and stopped in the standby positions, preparations for receiving the next warped substrate W1 are complete.

As described above, this embodiment can position a distorted substrate in a predetermined position, correct the distorted substrate into a straight shape, and accurately hold the corrected substrate by positioning it, thereby further improving the substrate transfer efficiency.

The present invention is not limited to the above-described embodiments, and various changes and modifications can be made within the spirit and scope of the present invention. Therefore, to apprise the public of the scope of the present invention, the following claims are made.

The invention claimed is:

1. A transfer method of transporting and positioning a curved substrate, correcting the substrate into a straight shape by pressing a substrate surface of the substrate, and transferring the corrected substrate, the method comprising: a setting step of setting a work range for the substrate based on a contour of the substrate in an uncurved straight state; a correction step of correcting the substrate into a straight shape by pressing a pressing member against the substrate surface of the substrate within the work range; the correction step includes: a blowing step of blowing air to the substrate surface of the substrate and a pressing step of pressing the pressing member against the substrate surface of the substrate; a positioning step of positioning the corrected substrate; a suction holding step of holding the positioned corrected substrate by suction; and a transfer step of transferring the corrected substrate held by suction.

2. The transfer method according to claim 1, wherein the positioning step includes a positioning movement step of moving the corrected substrate in a direction parallel to the substrate surface within the work range while pressing the corrected substrate, and positioning the corrected substrate in a predetermined position.

3. The transfer method according to claim 1, further comprising a positioning cancellation step of canceling positioning of the corrected substrate,
    wherein after the suction holding step, the method proceeds to the transfer step through the positioning cancellation step.

* * * * *

UNITED STATES PATENT AND TRADEMARK OFFICE
CERTIFICATE OF CORRECTION

PATENT NO. : 10,919,710 B2
APPLICATION NO. : 15/957366
DATED : February 16, 2021
INVENTOR(S) : Yoichi Hirasawa and Shuichi Komuro Page 1 of 1

It is certified that error appears in the above-identified patent and that said Letters Patent is hereby corrected as shown below:

In the Specification

Column 10, Line 51, change "CU1 1" to --CU11--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*